United States Patent [19]

Strohschneider, deceased

[11] Patent Number: 4,799,006
[45] Date of Patent: Jan. 17, 1989

[54] ATE TEST FIXTURE HAVING A SELF-SEALING VACUUM SKIRT

[75] Inventor: Heinz F. Strohschneider, deceased, late of Plymouth, Mass., Strohschneider; Waltraud B., legal representative

[73] Assignee: Augat Inc., Mansfield, Mass.

[21] Appl. No.: 62,501

[22] Filed: Jun. 11, 1987

[51] Int. Cl.⁴ .............................................. G01R 31/02
[52] U.S. Cl. ............................ 324/158 F; 324/73 PC
[58] Field of Search ........... 324/158 F, 158 P, 73 PC, 324/72.5, 73 AT; 269/21

[56] References Cited

U.S. PATENT DOCUMENTS

| | | | |
|---|---|---|---|
| 3,965,932 | 6/1976 | Wysocki et al. | 137/607 |
| 4,164,704 | 8/1979 | Kato et al. | 324/73 |
| 4,230,985 | 10/1980 | Matrone et al. | 324/158 |
| 4,245,274 | 1/1981 | MacDonald et al. | 361/429 |
| 4,288,745 | 9/1981 | Plante et al. | 324/158 |
| 4,290,015 | 9/1981 | Labriola | 324/158 |
| 4,321,533 | 3/1982 | Matrone | 324/158 |
| 4,342,957 | 8/1982 | Russell | 324/73 |
| 4,342,958 | 8/1982 | Russell | 324/73 |
| 4,352,061 | 9/1982 | Matrone | 324/158 |
| 4,357,062 | 11/1982 | Everett | 339/18 |
| 4,427,250 | 1/1984 | Hines et al. | 339/75 |
| 4,459,693 | 7/1984 | Prang et al. | 371/20 |
| 4,471,298 | 9/1984 | Frohlich | 324/73 |
| 4,496,903 | 1/1985 | Paulinski | 324/158 |
| 4,544,886 | 10/1985 | Murray et al. | 324/158 |
| 4,551,675 | 11/1985 | Heys et al. | 324/158 |
| 4,573,009 | 2/1986 | Fowler et al. | 324/158 |
| 4,583,042 | 4/1986 | Riemer | 324/73 |
| 4,626,776 | 12/1986 | Wilkinson | 324/73 PC |
| 4,667,155 | 5/1987 | Coiner et al. | 324/158 F |

OTHER PUBLICATIONS

"Improvement by . . . "; Electronic Engineering; Dec. 1982; p. 9.
Modular Molded Vacuum Fixturing, by VPC (Virginia Panel Corporation).

Primary Examiner—Ernest F. Karlsen
Attorney, Agent, or Firm—Weingarten, Schurgin, Gagnebin & Hayes

[57] ABSTRACT

In one embodiment, a skirt of an integral resilient material having a L-shaped cross-section is disclosed, and in another embodiment a skirt of an integral resilient material having a F-shaped cross-section is disclosed. The skirts are for sealing the peripheral interface defined between relatively movable electronic circuit device receiving and probe support boards of a test fixture for automatic testing equipment (ATE). The skirts preferably are of an elastomeric material. In the F-shaped embodiment, the skirt is also self-seating against the lateral edge of the probe support board.

9 Claims, 1 Drawing Sheet

ATE TEST FIXTURE HAVING A SELF-SEALING VACUUM SKIRT

FIELD OF THE INVENTION

The present invention is directed to the field of automatic testing, and more particularly, to a novel automatic testing equipment test fixture having a self-sealing vacuum skirt.

BACKGROUND OF THE INVENTION

Vacuum actuated test fixtures, such as those in U.S. Pat. Nos. 4,598,246 and 4,625,164, both incorporated herein by reference, are known for receiving electronic circuit devices to be tested, and for electrically interconnecting the received electronic circuit devices to automatic testing equipment.

The electronic circuit devices are received on a movable receiving face that is resiliently supported on coil springs fastened to a stationary board supporting plural probes electrically connected to the automatic testing equipment. The peripheral interface between the movable device receiving face and the stationary probe support board includes a vacuum-tight resilient hinge comprised of a resilient sheet material, to which the electornic circuit device receiving face is attached. The peripheral boundary of the resilient sheet material is held against the stationary probe support board against upstanding sideboards supported off the probe support board.

The retained resilient hinge interface is disadvantageous in several respects. It requires separate retainers and sideboards so that the construction is costly insofar as it requires multiple components that must be severally purchased and inventoried. The construction furthermore is expensive from a personnel point of view. It is necessary to adhere the resilient skirt to the device receiving face, and to retain it against the sideboards, which represents significant time and labor. In addition, the upstanding sideboard are supported on the probe board with a plurality of machine screws and require air-tight sealing after installation. Their structure must be disassembled to drill the probe plate, and then reassembled, required considerable time labor.

SUMMARY OF THE INVENTION

In accordance with a principal object of the present invention, a unitary resilient skirt for sealing the peripheral interface defined between automatic testing equipment (ATE) movable circuit receiving and stationary probe support boards is provided. In one embodiment, the skirt has an L-shaped cross section, one leg of which is in sealing relation with the fixed probe support board and the other leg of which is in sealing relation with the movable circuit receiving face. The L-shaped skirt in the preferred embodiment is constructed out of a spongy elastomer. In a second embodiment, the sealing skirt has an F-shaped cross-section, the base and the lower arm of which is in a self-seating sealing relation with the stationary probe support board, and the head or the top arm of which is in sealing relation to the movable device receiving face. In the F-shaped embodiment, a solid elastomer can be used. In both embodiments, the integral nature of the self-sealing vacuum skirts not only achieve significantly improved materials and labor savings and present a more satisfying appearance to the eye but also achieve highly effective vacuum seals during testing head operation.

BRIEF DESCRIPTION OF THE DRAWINGS

Other objects, aspects and advantages of the instant invention will become apparent as the invention becomes better understood by referring to the following detailed description of the invention, and to the drawings, wherein.

DETAILED DESCRIPTION OF THE INVENTION

Figure 1:
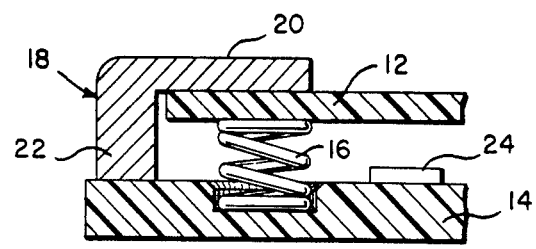
FIG. 1 is a partial sectional view illustrating in its unactuated condition one embodiment of the automatic testing equipment test fixture having a self-sealing vacuum skirt according to the present invention.

Referring now to FIG. 1, generally designated at 10 is a partial sectional diagram of the novel ATE test fixture having a self-sealing vacuum skirt according to the present invention. The fixture 10 includes an electronic circuit board receiving face 12 mounted for reciprocating motion to a stationary probe support board 14 via a plurality of circumferentially disposed coil springs 16 and vertical registration pins (not shown) to prevent motion in any lateral direction. The probe support board 14 includes a plurality of upstanding spring-loaded contacts, preferably POGO contacts, not shown, that are fastened about the probe support board defining an intended contact array pattern. The contacts are electrically connected to automatic testing equipment.

Figure 2:
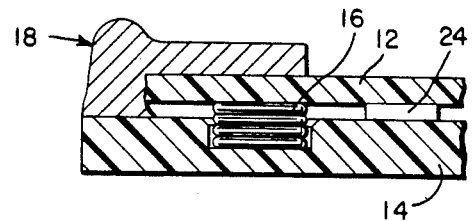
FIG. 2 illustrates the same embodiment but in its actuated condition.

An integral self-sealing vacuum skirt generally designated 18 is provided at and along the peripheral interface defined between the movable electronic circuit device receiving face 12 and the stationary probe support board 14. The skirt 18 includes a sealing leg 20 that seals the edge of the movable face 12 for that portion of the surface thereof adjacent its peripheral boundary. The skirt 18 further includes a stationary probe support board sealing leg 22 that is seated on the peripheral ledge of the stationary probe support board 14 and is in a sealing relation therewith. The legs 20, 22 have an L-shaped cross-section. Stops 24 are provided on the board 14 for limiting the deflection of the movable device receiving face 12. A vacuum pump, not shown, is coupled to the chamber defined by and between the receiving face 12, the skirt 18 and the probe support board 14 for evacuating the chamber and thereby inducing the pressure of the atmosphere to overcome the resilience of the springs 16 thereby urging the face 12 downwardly against the stops 24, as seen in FIG. 2. The vacuum acts on the legs 20, 22 of the skirt 18, drawing the corresponding interfaces thereof together into a sealing, vacuum-tight relationship with the confronting surfaces of the members 12, 14. The material of the skirt 18 is preferably selected to be a spongy elastomer, where, upon vacuum release, the face 12 and therewith the skirt 18 return to their unactuated conditions, all the while maintaining the vacuum seals, as illustrated in FIG. 1.

Figure 3:
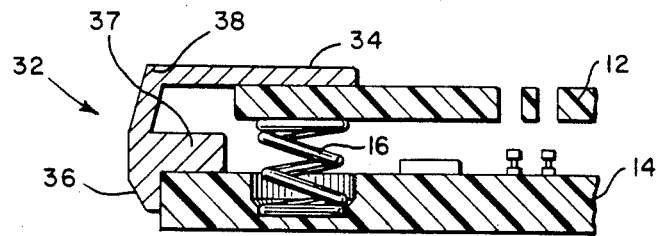
FIG. 3 is a partial sectional diagram illustrating another embodiment of the automatic testing equipment test fixture having a self-sealing vacuum skirt according to the present invention in its unactuated condition.

Referring now to FIG. 3, generally designated at 30 is another embodiment of the ATE test fixture having a self-sealing vacuum skirt according to the present invention. The fixture 30 is substantially identical to the fixture 10 of the FIGS. 1 and 2 embodiment, except a differently shaped self-sealing vacuum skirt generally designated 32 is provided. The skirt 32 includes a head portion 34 for sealing with the confronting surface of the movable device receiving face 12, a self-seating leg 36 and arm 37 for sealing with the peripheral edge of the stationary probe support board 14, and an intermediate resilient portion 38 defining an integral resilient hinge that allows movement of the leg 34 in such a way as to effectively decouple any mechanical force transmission through the hinge 38 and into the self-seating leg 36 and arm 37 in sealing relation with the stationary probe support board. The skirt 32 has a generally F-shaped cross-section.

Figure 4:
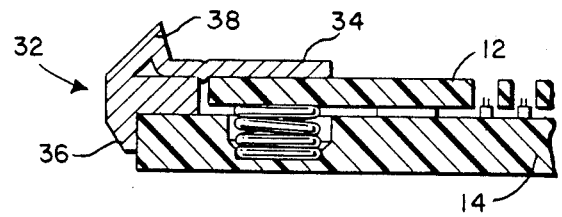
FIG. 4 is a partial sectional diagram of the second embodiment in its actuated condition.

In operation, with the actuation of the vacuum, the atmospheric pressure bears down on the head 34 and against the leg 36 of the skirt 32, bringing the confronting surface of the electronic circuit device receiving face 12 and stationary probe support board 14 into sealing relation therewith. As the board moves into its actuated position illustrated in FIG. 4, the hinge 38 buckles in the direction of motion and inward toward the test fixture head. With the release of the vacuum and the return of the fixture to its unactuated condition, illustrated in FIG. 3, the hinge 38 freely follows the upward motion of the electronic device receivign face 12, and the self-seating leg 36, that is mechanically and force decoupled from the movement of the face 12 and head portion 34, retains its self-sealed and seated relation with the probe support board, all the while the vacuum is cyclically maintained and released. The material of the skirt 32 can be any suitable elastomer, such asurethane or NEOPRENE.

It will be appreciated that many modifications including dimensional changes, configurations, opening dimensions of the hinge, different geometry hinges, different kinds of self-seating and self-sealing surfaces and abutting portions will become apparent to those skilled in the art having the benefit of this disclosure without departing from the scope and spirit of the claimed invention.

What is claimed is:

1. An automatic testing equipment test fixture having a self-sealing vacuum skirt for testing an electronic circuit device to be tested, comprising:
   an electronic circuit device to be tested receiving face having a circumferential edge, a first rim close to the edge and confronting the electronic circuit device to be tested, and a second rim close to the edge that opposes the first rim;
   a probe support board having a circumferential edge, and a first rim close to the edge and confronting the electronic circuit device to be tested receiving face;
   means coupled between said face and said board for supporting said face and said board in spaced-apart relation that defines an open peripheral interface between said face and said board for relative movement reciprocally along an axis generally parallel to a perpendicular of said face and said board; and
   a free-standing resilient skirt having a first portion for sealing with the first rim of the electronic circuit device receiving face and a second portion for sealing with at least the first rim of the probe support board, which said first and said second portions are integrally formed with said skirt and extend about the peripheral interface defined between said face and said board, the first portion for sealing with the first rim ofthe electronic circuit circuit device receiving face being a lip that seats against and is supported by the confronting surface of the first rim but does not seat against nor seal said second rim of said receiving face, the second portion for sealing with at least the first rim of the probe support board being a lip that seats against and is supported by the confronting surface of at least the first rim of said probe support board.

2. The invention of claim 1, wherein said skirt has an L-shaped cross-section.

3. The invention of claim 2, wherein said L-shaped cross-section skirt first portion extends in a direction that is parallel to the electronic circuit device receiving face and said L-shaped cross-section skirt second portion extends in a direction that is parallel to a perpendicular of the probe support board.

4. The invention of claim 3, wherein said integral skirt is fashioned of a spongy elastomer material.

5. The invention of claim 1, further including a portion intermediate to said first portion and said second portion and integral with said skirt for effectively decoupling mechanical force transmission between said first and said second portions due to relative movement of the electronic circuit device receiving face and the probe support board.

6. The invention of claim 5, wherein said decoupling portion includes a resilient hinge spaced from said first and said second portions that defines a clearance into which the hinge can collapse as the electronic circuit receiving face and probe support board are moved relative to each other.

7. The invention of claim 6, further including means for seating said probe board sealing second portion in an intended relation with the probe support board.

8. The invention of claim 7, wherein the seating means includes a skirt portion integral with the skirt that extends in a direction that is parallel to a perpendicular of the probe support board and downwardly and along the outside circumferential edge thereof.

9. The invention of claim 8, wherein said resilient skirt has a F-shaped cross-section and is fashioned from a solid elastomeric material.

* * * * *